United States Patent
Boujamaa (10) Patent No.: US 10,700,644 B1
(45) Date of Patent: Jun. 30, 2020

(54) CIRCUITS AND METHODS FOR PROVIDING A TRIMMABLE REFERENCE IMPEDANCE

(71) Applicant: Arm Limited, Cambridge (GB)

(72) Inventor: El Mehdi Boujamaa, Valbonne (FR)

(73) Assignee: Arm Limited, Cambridge (GB)

( * ) Notice: Subject to any disclaimer, the term of this patent is extended or adjusted under 35 U.S.C. 154(b) by 18 days.

(21) Appl. No.: 16/212,380

(22) Filed: Dec. 6, 2018

(51) Int. Cl.
*H03F 1/30* (2006.01)
*G11C 13/00* (2006.01)

(52) U.S. Cl.
CPC ......... *H03F 1/30* (2013.01); *G11C 13/0007* (2013.01); *G11C 13/0028* (2013.01); *G11C 2213/79* (2013.01)

(58) Field of Classification Search
CPC ....................................................... H03F 1/30
USPC ....................................................... 330/289
See application file for complete search history.

(56) References Cited

U.S. PATENT DOCUMENTS

| | | | | |
|---|---|---|---|---|
| 6,288,600 B1* | 9/2001 | Kadowaki | ............... | G04F 5/10 323/313 |
| 6,424,131 B1* | 7/2002 | Yamamoto | ......... | H03K 17/0822 323/282 |
| 6,646,463 B1* | 11/2003 | Hariton | ................. | H03H 11/48 326/21 |
| 2004/0233600 A1* | 11/2004 | Yoshida | ................... | G05F 3/30 361/90 |
| 2005/0194954 A1* | 9/2005 | Draxelmayr | ............ | G05F 3/265 323/313 |
| 2006/0164158 A1* | 7/2006 | Kimura | ..................... | G05F 3/30 327/539 |
| 2012/0326768 A1* | 12/2012 | Bhattacharya | .......... | H03F 1/308 327/524 |
| 2016/0266598 A1* | 9/2016 | Wong | ....................... | G05F 3/30 |

* cited by examiner

*Primary Examiner* — Patricia T Nguyen
(74) *Attorney, Agent, or Firm* — Pramudji Law Group PLLC; Ari Pramudji (57) ABSTRACT

Briefly, embodiments of claimed subject matter relate to determination of a high-impedance state or a low-impedance state of a resistive memory element over a wide range of temperature, such as temperatures approaching −40.0° C. to temperatures approaching +125.0° C. Such determination may be brought about by implementing a circuit which, according to various embodiments described herein, emulates a reference impedance having a negative temperature coefficient.

21 Claims, 6 Drawing Sheets

CIRCUITS AND METHODS FOR PROVIDING A TRIMMABLE REFERENCE IMPEDANCE

TECHNICAL FIELD

This disclosure relates to circuits and methods for providing a trimmable or tunable reference impedance, such as for use in reading binary logic values stored in a resistive memory device.

BACKGROUND

In a computing device, which may include devices such as general purpose hand-held computers, gaming devices, communications devices, smart phones, embedded or special-purpose computing systems, memory devices may be utilized to store instructions for use by one or more processors of the computing device. Memory devices suitable for use in at least some types of computing devices may include resistive memory devices, which operate to store binary logic values, such as a binary logic "1" or a binary logic "0," utilizing resistive states of an appropriate material. In one example, in a resistive memory, a binary logic "1" may be stored responsive to placing the resistive memory element into a relatively high-impedance state. The resistive memory may store a binary logic "0" responsive to placing the resistive memory into a relatively low-impedance state.

When reading binary logic values stored by way of a resistive memory element, a "sense" voltage may be applied at a particular memory address within an array of resistive memory elements. Responsive to a voltage drop, which may form across the resistive memory device after application of a sense voltage, a sense amplifier may be utilized to determine the logic state of the particular resistive memory element. When a binary logic "1" is detected, the sense amplifier may generate a signal comprising a first voltage level. Detection of a binary logic "0" may give rise to the sense amplifier generating a signal comprising a second voltage level. In particular implementations, a reference impedance may be utilized by a sense amplifier to assist in differentiating, for example, a high-impedance state from a low-impedance state of a resistive memory element. Such differentiation may be performed, for example, responsive to performing a comparison between a voltage drop across the resistive memory device and a voltage drop across the reference impedance.

However, in many computing devices, it may be advantageous for an appreciable difference in resistivity to exist between a reference impedance and a high-impedance state as well as between a reference impedance and a low-impedance state. In addition, it may be advantageous for such impedance differences to exist over a significant range of operating temperatures, such as temperatures from below about 0.0° C., to temperatures in excess of about 100.0° C. Accordingly, providing reference impedances, which can be trimmed or tuned to provide particular impedances that enable reliable detection of high-impedance/low-impedance states of a resistive memory elements continues to be an active area of investigation.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, or apparatuses described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

As previously mentioned, computing devices, such as general purpose hand-held computers, gaming devices, communications devices, smart phones, embedded or special-purpose computing systems, memory devices may be utilized to store instructions for use by one or more processors of the computing device. In many instances, memory devices may utilize resistive or impedance states of an appropriate material to encode a binary logic value. For example, in one instance, a resistive memory element may operate to store a binary logic "1" utilizing a relatively low-impedance state, while a binary logic "0" may be stored via utilizing a relatively high-impedance state of a resistive memory device. However, it should be understood that such designations are arbitrary, and alternative memory devices may operate differently, and claimed subject matter is not limited in this respect. Thus, in another embodiment, a resistive memory element may store a binary logic "1" utilizing a relatively high-impedance state and may store a binary logic "0" utilizing a relatively low-impedance state, for example.

When reading binary logic values from a resistive memory element, such as a magnetic random-access memory (MRAM) element (e.g., a magnetic tunneling junction (MTJ) element), a correlated electron random access memory element (CERAM), a phase change memory (PCM) element, or the like, a computing device may apply a sense voltage to a particular memory element. In response to a voltage drop, which may form across the resistive memory element after application of a sense voltage, a sense amplifier may provide, for example, a first output signal when a high-impedance state is detected and may provide a second output signal when a low-impedance state is detected. In particular embodiments, determination of a relatively high-impedance state or a relatively low-impedance state may be performed responsive to comparison of an output signal from a resistive memory element with an output signal from a reference impedance.

In many computing devices, it may be advantageous for a significant difference in resistivity to exist between a reference impedance and a high-impedance state of a resistive memory element. Likewise, it may be advantageous for a significant difference in resistivity to exist between the reference impedance and a low-impedance state of a resistive memory element. Further, at least in particular embodiments, it may be especially beneficial for a resistance value of a reference impedance to comprise a resistivity that lies between a high-impedance state and a low-impedance state of a resistive memory element. Such an arrangement may be useful in maintaining simplicity of resistive memory read circuitry, such as sense amplifiers, memory controllers, and so forth.

In addition, it may also be advantageous for a value of a reference impedance to remain between an impedance corresponding to a high-impedance state and a low-impedance state of a resistive memory element across a wide operating range of temperatures of operation of a computing device. Thus, a resistance value of a reference impedance may comprise a value between an impedance corresponding to a high-impedance state and a low-impedance state from temperatures of, for example, about −40.0° C. to about +125.0° C., although claimed subject matter is not limited in this respect. Accordingly, a computing device may be designed so as to perform satisfactorily, such as by faithfully executing instructions written to resistive memory elements, over a wide variety of potential operating temperature ranges.

As discussed further herein, certain resistive memory technologies, such as magnetic tunneling junction technologies, may comprise a negative temperature coefficient. In this context, a memory element comprising a negative temperature coefficient is defined as a memory element for which resistivity decreases as operating temperature increases. Thus, for example, in a high-impedance state, a resistive memory element formed from a magnetic tunneling junction may exhibit a resistivity at 100.0° C., for example, that is perhaps one-half the resistivity exhibited at 0.0° C. Additionally, in a low-impedance state, such a memory element may exhibit a different temperature coefficients such as, for example, a relatively stable or slightly positive temperature coefficient. In this context, a memory element comprising such a temperature coefficient is defined as a memory element for which resistivity remains constant, or slightly increases, as operating temperature increases. It should be noted, however, that other types of resistive memory technologies may exhibit differing temperature coefficients, and claimed subject matter is not limited in this respect. Accordingly, at least in embodiments utilizing resistive memory elements that exhibit negative temperature coefficients, it may be advantageous for reference impedances to also exhibit negative temperature coefficients. In particular embodiments, such reference impedances may be capable of remaining between a high-impedance state and a low-impedance state of a resistive memory element over a wide range of operating temperatures. In this context, a "read margin" is defined as a difference in resistivity between a reference impedance and an impedance exhibited by resistive memory element operating in a high-impedance state. A read margin may also encompass a difference in resistivity between a reference impedance and an impedance exhibited by a resistive memory element operating in a low-impedance state.

However, in particular wafer fabrication processes, such as those utilized to form arrays of resistive memory elements, obtaining a reference impedance having a negative temperature coefficient may be problematic. Accordingly, as discussed herein, maintaining a difference in impedance, over a range of operating temperatures, between a reference impedance and an impedance exhibited by resistive memory elements operating in high- and low-impedance states may be difficult to achieve. Consequently, in order to utilize particular fabrication technologies and/or processes, complicated and/or cumbersome techniques and/or circuitry may be required in order to achieve satisfactory performance.

In particular embodiments, an electrical circuit may be fabricated so as to emulate a resistive element comprising a negative temperature coefficient. Accordingly, a reference impedance may be fabricated so as to maintain a relatively wide margin between a high-impedance state of a resistive memory device and a low-impedance state of a resistive memory device. The electrical circuit may be implemented utilizing a variety of arrangements of circuit elements in a manner that may only marginally impact cost and/or complexity of memory circuitry. Further, certain embodiments may permit a circuit designer to select from among a variety of resistor device types, which may provide a high degree of design freedom. In certain embodiments, such design freedom may allow a circuit designer to achieve, for example, memory system performance specifications. Additionally, some embodiments may utilize resistive memory elements as reference impedances, which may simplify fabrication processes, such as by avoiding special process steps to form alternative types of reference impedances. Further, particular embodiments may be applied in connection with a variety of resistive memory technologies, such as MRAM elements (e.g., MTJ), CERAM, PCM, ReRAM, or the like. Resistive memory elements may exhibit an impedance ratio between a high-impedance state and a low-impedance state of, for example, between about 2.0:1.0 to about 4.0:1.0, although claimed subject matter is intended to embrace virtually all impedance ratios between high-impedance state and low-impedance states of resistive memory elements. Accordingly, in other embodiments, resistive memory elements may exhibit an impedance ratio between a high-impedance state and a low-impedance state of between about 2.0:1.0 to about 400.0:1.0, for example.

Before discussing embodiments in reference to the accompanying figures, a brief description of various non-limiting embodiments is provided. For example, an apparatus, which may be utilized to generate a reference impedance, for example, may comprise an electrical circuit having first and second current sources to provide current to corresponding input signal nodes of first and second impedances. In one embodiment, the first and second impedances may comprise resistive elements, such as silicide/non-silicide polysilicon resistors (P and N type), silicide/non-silicide diffused resistors (P and N type), and metal resistors, for example. In another embodiment, first and second impedances may comprise resistive elements, which may be formed from materials utilized in the fabrication of resistive memory elements, such as magnetic tunneling junction materials placed into low-impedance and high-impedance states, and claimed subject matter is not limited in this respect. The apparatus may additionally comprise an amplifier, which may comprise one or more transistor devices (e.g., metal oxide semiconductor field effect transistors (MOSFET) devices), having input signal nodes coupled to corresponding input signal nodes of the first and second impedances. The apparatus may additionally comprise a transistor circuit, wherein the gate of the transistor circuit is coupled to an output signal node of the amplifier, and wherein the drain-to-source impedance of the transistor circuit emulates a negative temperature coefficient that is based on a difference between the first and the second impedances.

In another embodiment, a method, which may relate to generating a reference impedance, may comprise activating first and second current sources to provide an electric current to corresponding input signal nodes of first and second impedances. The input signal nodes of the first and second impedances may be coupled to corresponding first and second input signal nodes of an amplifier. The method may further comprise coupling an electric current from the amplifier to a transistor circuit, wherein the drain-to-source impedance of the transistor circuit emulates a negative temperature coefficient that is based on a difference between the first impedance and the second impedance. The method may further comprise determining the state of a resistive memory element, such as a MRAM element (e.g., MTJ), CERAM, PCM, or the like, based on a voltage level of the electric current from the amplifier to the transistor circuit.

In yet another embodiment, a circuit, which may be utilized to generate a reference impedance that decreases with increasing temperature (e.g., a reference impedance emulating a negative temperature coefficient), may comprise first and second current sources to provide substantially identical currents to corresponding input signal nodes of first and second impedances. The circuit may further comprise an amplifier having input signal nodes coupled to the corresponding input signal nodes of the first and the second impedances. The circuit may additionally comprise a transistor circuit having a first node coupled to an output signal node of the amplifier and having a second node coupled to an output signal node of an impedance of the first impedance and the second impedance. In an embodiment, the drain-to-source impedance of the transistor circuit may exhibit a reference impedance that is based on a difference between the first and the second impedances.

Particular embodiments will now be described with reference to the figures, such as FIG. 1A, which illustrates a circuit diagram (100) comprising a sense amplifier coupled to a reference impedance and coupled to a resistive memory element. In a diagram 100, sense amplifier 110 comprises two or more input signal nodes, such as those labeled $V_{REF}$ and $V_{BIT}$. In diagram 100, a signal at node $V_{REF}$ may represent a signal input from a reference side 160 and a signal at node $V_{BIT}$ may represent a signal input from bit side 170. Thus, responsive to a voltage signal applied at word-line 140 (WL 140 in FIG. 1A), which may permit a current to conduct from voltage input $V_{SS}$ in the direction of sense amplifier 110, the sense amplifier may provide output logic signal 175. In particular embodiments, logic signal 175 may comprise a two-state output signal, such as a signal comprising a relatively low voltage, responsive to a presence of a voltage signal at node $V_{BIT}$ comprising a value less than a voltage signal at $V_{REF}$. A second state of the logic signal 175 may comprise a relatively high voltage, responsive to a presence of a signal at node $V_{BIT}$ comprising a value greater than a voltage signal at $V_{REF}$. It should be noted that sense amplifier 110 may operate differently, such as to provide a relatively high voltage responsive to a presence of a voltage at signal node $V_{BIT}$ comprising a value greater than a voltage signal at $V_{BIT}$ and providing a relatively low voltage responsive to a presence of a signal at node $V_{BIT}$ comprising a value less than a voltage signal at $V_{REF}$, and claimed subject matter is not limited in this respect.

In diagram 100, low-resistance state (LRS) resistive memory element 130 (LRS 130) and low-resistance state/high-resistance state resistive memory element 135 (LRS/HRS 135) comprise resistive memory elements capable of switching between a high-impedance state and a low-impedance state, so as to permit storage of logic values, such as a logic "0" and a logic "1." Thus, for example, resistive memory element 135 may store a logic "0" responsive to placing the memory element into a low-impedance state. Resistive memory element 135 may store a logic "1" responsive to placement of the memory element into a high impedance state. In diagram 100, resistive memory element 130, which may operate utilizing principles similar to that of resistive memory element 135, has been placed into a long-term low-impedance state, such as during fabrication of the circuit of diagram 100. Trimming resistor 120 ($R_T$ 120 in FIG. 1A) may provide an additional resistance to complement the resistance of resistive memory element 130.

Thus, in operation, when resistive memory element 135 comprises a high-impedance state, and responsive to word-line 140 attaining a voltage value sufficient to conduct current through transistor 144, a voltage signal at $V_{BIT}$ may comprise a value less than a voltage signal at $V_{REF}$. Consequently, logic signal 175 may comprise a relatively low value, for example. Further, when resistive memory element 135 comprises a low-impedance state, and responsive to word-line 140 attaining voltage value sufficient to conduct current through transistor 144, a voltage signal at $V_{BIT}$ may comprise a value greater than the voltage signal at $V_{REF}$. Consequently, logic signal 175 may comprise a relatively high value, for example.

However, as previously mentioned, sensing a voltage difference between $V_{BIT}$ and $V_{REF}$ may be problematic. To illustrate, FIG. 1B comprises a plot (150) of resistance as a function of temperature of various circuit elements of FIG. 1A. As shown in FIG. 1B, when resistive memory element 135 is placed into a low-impedance state, resistivity of the memory element (depicted line by HRS Bit (135) in FIG. 1B) may be seen as comprising a negative temperature coefficient. Conversely, when resistive memory element 135 is placed into a low-impedance state, resistivity of the memory element (depicted by line LRS Bit (135) in FIG. 1B) may be seen as comprising a slightly positive temperature coefficient. When resistance of trimming resistor 120 (depicted by line $R_T$ (120) in FIG. 1B) is combined with resistive memory element 130, the combined resistivity as a function of temperature in degrees Celsius is depicted as line LRS (130)+$R_T$ (120). Thus, a voltage present at node $V_{BIT}$ may be represented by either line HRS Bit (135) or by line LRS Bit (135) depending on the high-impedance/low-impedance state of resistive memory element 135. Further, a voltage present at node $V_{REF}$ of FIG. 1A may be depicted by line LRS (130)+$R_T$(120).

Accordingly, as depicted in FIG. 1B, at relatively high temperatures (e.g., temperatures of about 125.0° C.), a read margin between HRS Bit (135) and LRS(130+$R_T$(120) appears approximately equal to a read margin between LRS Bit (135) and LRS(130)+$R_T$(120). Thus, at least within certain ranges of temperature, sense amplifier 110 of FIG. 1A may be capable of ascertaining the low-impedance/high-impedance state of resistive memory element 135. However, at relatively low temperatures (e.g., temperatures of about −40.0° C.), a read margin between HRS Bit(135) appears much larger than a read margin between LRS Bit (135) with respect to LRS(130)+$R_T$(120). Thus, responsive to such unequal read margins at other ranges of temperature, sense amplifier 110 may be unable to reliably detect a state of resistive memory element 135.

Figure 1A:
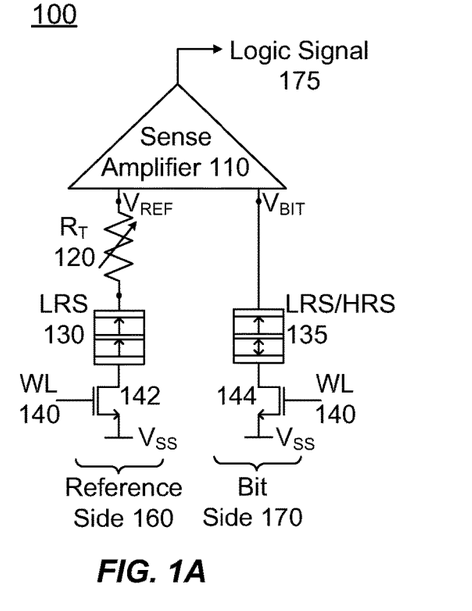
FIG. 1A is a circuit diagram illustrating a sense amplifier coupled to a reference impedance and coupled to a resistive memory element.
Figure 2A:
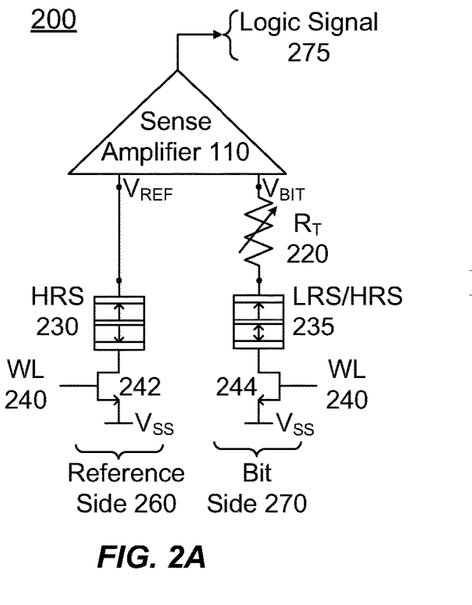
FIG. 2A is a circuit diagram illustrating a sense amplifier coupled to a reference impedance and coupled to a resistive memory element.

FIG. 2A comprises a circuit diagram (200) illustrating a sense amplifier coupled to a reference impedance and coupled to a resistive memory element. Similar to that of FIG. 1A, sense amplifier 110 of FIG. 2A comprises two or more input signal nodes, such as those labeled $V_{REF}$ and $V_{BIT}$. In diagram 200, a signal at node $V_{REF}$ may represent a signal input from a reference side 260, and a signal at node and $V_{BIT}$ may represent a signal input from bit side 270. Thus, responsive to a voltage signal applied at word-line 240 (WL 240 in FIG. 2A), an electric current may be conducted from voltage input $V_{SS}$ in the direction of sense amplifier 110. Accordingly, sense amplifier 110 may provide output logic signal 275, which may comprise voltage levels similar to those of logic signal 175 of FIG. 1A.

In diagram 200, resistive memory element 230 (HRS 230) comprises a reference impedance at reference side 260. In particular embodiments, resistive memory element 230 may be placed into a long-term high-impedance state, such as during fabrication of the circuit of diagram 200. At bit side 270, resistive memory element 235 may be placed into either a high-impedance state or a low-impedance state, which may, as previously described, facilitate storage of either a binary logic "0" or a binary logic "1." Trim resistor ($R_T$ 220 in FIG. 2A) may provide an additional resistance to complement the resistance of resistive memory element 235.

Thus, in operation, when resistive memory element 235 comprises a high-impedance state, and responsive to word-line 240 attaining a voltage value sufficient to conduct current through transistors 242 and 244, a voltage signal at $V_{BIT}$ may comprise a value less than a voltage signal at $V_{REF}$. Consequently, logic signal 275 may comprise a first voltage. Further, when resistive memory element 235 comprises a low-impedance state, and responsive to word-line 240 attaining a voltage value sufficient to conduct through transistor 244, a voltage signal at $V_{BIT}$ may comprise a value greater than the voltage signal at $V_{REF}$. Consequently, logic signal 275 may comprise a second voltage.

Figure 2B:
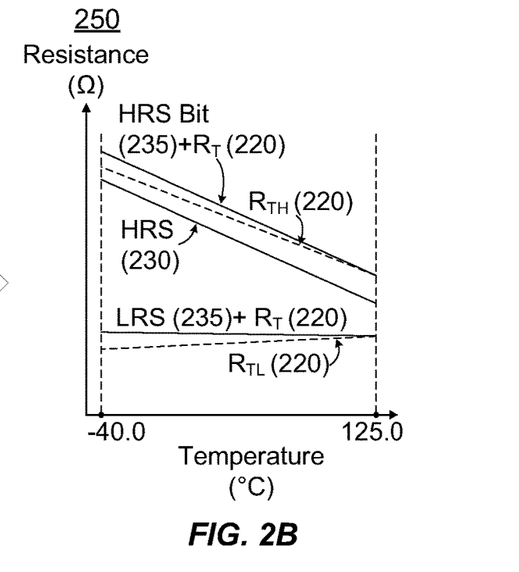
FIG. 2B is a plot of resistance as a function of temperature of various circuit elements of FIG. 2A.

FIG. 2B comprises a plot (250) of resistance as a function of temperature of various circuit elements of FIG. 2B. As depicted in FIG. 2B, when resistive memory element 235 is placed into a high-impedance state, the combined resistivity of memory element 235 and trimming resistor 220 (depicted as line HRS Bit(235)+$R_{TH}$(220)) appears to comprise a negative temperature coefficient. Additionally, when resistive memory element 235 is placed into a low-impedance state, the combined resistivity of memory element 235 and trimming resistor 220 (depicted as line LRS Bit(235)+$R_{TH}$ (220)) appears to comprise a slightly positive temperature coefficient. Accordingly, as depicted in FIG. 2B, at relatively high temperatures (e.g. temperatures of about 125.0° C.), a read margin between resistive memory element 235 (depicted as line HRS Bit(235)+$R_T$(130) in FIG. 2B) and the resistance of resistive memory element 230 (depicted as line HRS(230) in FIG. 2B) appears approximately equal to a read margin between resistive memory element 235 placed into a low-impedance state (depicted by LRS Bit(235)+$R_{TH}$(220) in FIG. 2B) and the resistance of resistive memory element 230. Thus, at least within certain temperature ranges, sense amplifier 110 of FIG. 2A may be capable of ascertaining the low-impedance/high-impedance state of resistive memory element 235. However, at relatively low temperatures (e.g., temperatures of about −40.0° C.), a read margin between resistive memory element 235 and operating in a high-impedance state (depicted by HRS Bit(235)+$R_T$(220) in FIG. 2B) appears much larger than a read margin between LRS(235)+$R_T$(220). Thus, responsive to such unequal read margins at lower ranges of operating temperature, sense amplifier 110 may be unable to reliably detect the high-impedance/low-impedance state of resistive memory element 235.

Figure 3A:
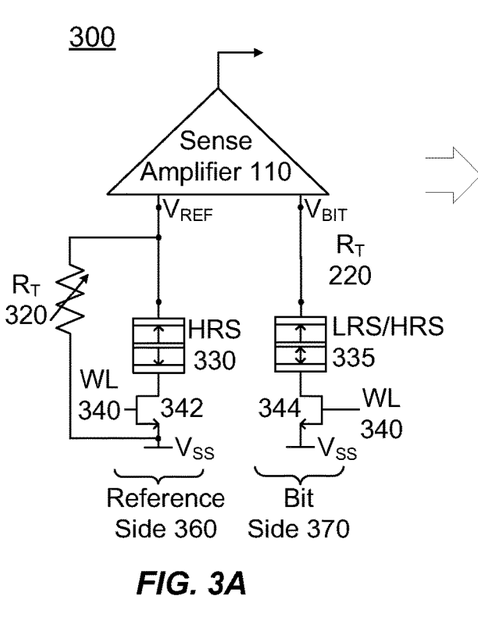
FIG. 3A is a circuit diagram illustrating a sense amplifier coupled to a reference impedance and coupled to a resistive memory element.

FIG. 3A is a circuit diagram (300) illustrating a sense amplifier coupled to a reference impedance and coupled to a resistive memory element. In diagram 300, at reference side 360, trimming resistor 320 ($R_T$(320) in FIG. 3A) is depicted as connected or coupled in parallel with the series combination of resistive memory element 330 (HRS(330)) and transistor 342. At bit side 370, resistive memory element 335 (LRS/HRS 335), which may comprise either a high-impedance state or a low-impedance state, is depicted as coupled in series with transistor 344. Thus, in operation, responsive to a signal at word-line 340, a current may conduct from $V_{SS}$ through resistive memory elements 330 and 335, thereby providing a voltage signal at nodes $V_{REF}$ and $V_{BIT}$.

Figure 3B:
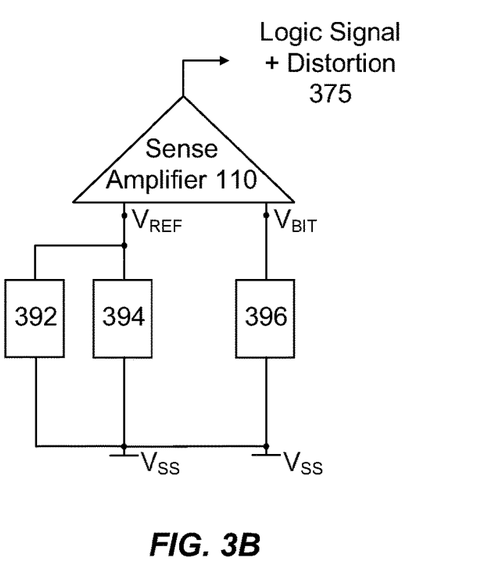
FIG. 3B is a diagram showing equivalent impedances of the circuit diagram of FIG. 3A and a possible effect of the equivalent impedances on an output signal of a sense amplifier in accordance with an embodiment.

However, although trimming resistor 320 may operate to modify a voltage present at node $V_{REF}$, which may thereby allow sense amplifier 110 to more reliably make comparisons between a voltage at node $V_{BIT}$ and $V_{REF}$, it may be appreciated that such an additional resistance may bring about an unbalancing effect between reference side 360 and bit side 370. Such unbalancing may, at least in particular embodiments, bring about noise and/or distortion at an output port of sense amplifier 110. Accordingly, as shown in FIG. 3B, $R_T$ 320 has been replaced with equivalent impedance 392; reference side 360 has been replaced with equivalent impedance 394; and bit side 370 has been replaced with equivalent impedance 396. Thus, in view of sense amplifier 110 performing a comparing function between signals at input nodes $V_{REF}$ and $V_{BIT}$, the parallel combination of the equivalent impedances 392 and 394 may vary significantly from equivalent impedance 396. Accordingly, although a logic signal (375) may be present at an output of the sense amplifier 110, such a logic signal is likely to comprise an unacceptable level of distortion.

Figure 4A:
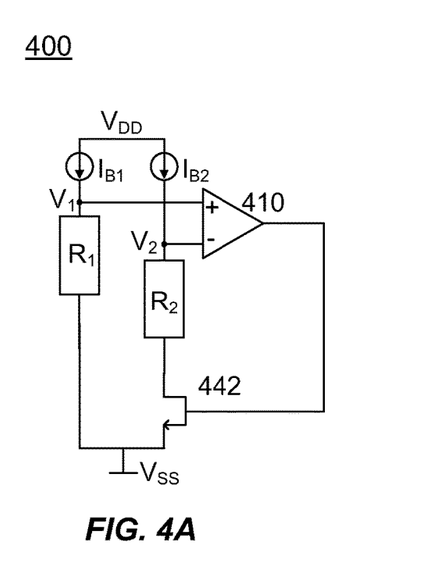
FIG. 4A is a diagram representing circuit elements of a reference impedance source in accordance with various embodiments described herein.
Figure 4B:
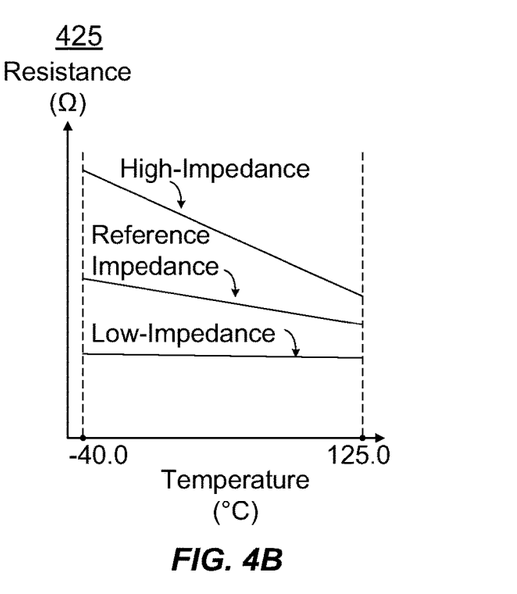
FIG. 4B is a plot of high-impedance state resistance, low-impedance state resistance, and reference impedance of the circuit of FIG. 4A in accordance with various embodiments described herein.

FIG. 4A is a diagram representing circuit elements of a reference impedance source in accordance with various embodiments described herein. The circuit elements of FIG. 4A may be implemented utilizing various circuit arrangements and topologies to provide resistances that comprise negative temperature coefficients. Accordingly, as shown in plot 425 of FIG. 4B, when combined with a sense amplifier, such as sense amplifier 110 of FIG. 1A, the circuit elements of FIG. 4A may emulate a reference impedance having a negative temperature coefficient and having wide read margins between a reference impedance and the high- and low-impedance states of a resistive memory element. Thus, as described herein, via selection of appropriate values for first and second resistances ($R_1$ and $R_2$ in FIG. 4A), a reference impedance may be selected to accord or track the negative temperature coefficient profile of a resistive memory element, such as a resistive memory element comprising a magnetic tunneling junction. Further, such tracking of the negative temperature coefficient of a resistive memory element may occur over a significant range of temperature, such as temperatures from about −40.0° C. to about 125.0° C., although claimed subject matter is not limited in this respect.

As depicted in FIG. 4A, a reference impedance may be emulated utilizing current sources $I_{B1}$ and $I_{B2}$, which operate to provide current to input nodes of resistors $R_1$ and $R_2$. Additionally, in the embodiment of FIG. 4A, a small current may be coupled to operational amplifier 410. An output port of operational amplifier 410 may be coupled to transistor 442, which may comprise a MOSFET transistor, for example. Thus, assuming negligible current flow into operational amplifier 410, voltages $V_1$ and $V_2$ may be computed from:

$$V_1 = I_{B1} R_1 \quad (1)$$

$$V_2 = I_{B2}(R_1 + R_{MOS}) \quad (2)$$

$R_{MOS}$ represents the drain-to-source resistance of transistor 442. Thus, when $V_1 = V_2$ and when $I_{B1} = I_{B2}$, then solving expressions (1) and (2) for $R_{MOS}$ provides:

$$R_{MOS} = R_1 - R_2 \quad (3)$$

Further, considering temperature variations, it may be appreciated that $R_{MOS}$ may be rewritten substantially in accordance with expression (4), below:

$$R_{MOS} = R_1(1 + TC_1 \cdot \Delta T) - R_2(1 + TC_2 \cdot \Delta T) \quad (4)$$

It may be appreciated that expression (4) may be rewritten in terms of a difference between $R_1$ and $R_2$, substantially in accordance with expression (5), below:

$$R_{MOS} = (R_1 - R_2)\left(\frac{R_1 TC_1 - R_2 TC_2}{R_1 - R_2} \Delta T\right) \quad (5)$$

Thus, from expression (5), when $TC_2 > TC_1$ and $$R_1 < R_2 \frac{TC_1}{TC_2},$$

a temperature coefficient of $R_{MOS}$ comprises a value of less than 0.0°/C. As previously discussed, such a result may be advantageous especially when fabricating integrated circuits, for example, utilizing processes for which resistors comprising negative temperature coefficients may be problematic to create. From expression 5, it may be appreciated that the quantity $$\frac{R_1 TC_1 - R_2 TC_2}{R_1 - R_2}$$

may be referred to as the difference between temperature coefficients of the first and second impedances. It may also be appreciated that, at least in particular embodiments, so long as the difference between temperature coefficients of the first and second impedances $$\left(\frac{R_1 TC_1 - R_2 TC_2}{R_1 - R_2}\right)$$

comprises a quantity less than 0.0, which may arise under a variety conditions, such as $R_1 TC_1 < 0$ and $R_2 TC_2 < 0$ or simply when $R_1 TC_1 < R_2 TC_2$, $R_{MOS}$ comprises a value of less than 0.0°/C.

It should also be noted that although the formulation of expression (3) involved the condition $I_{B1} = I_{B2}$, in particular embodiments, $I_{B1}$ and $I_{B2}$ may differ substantially from each other. For example, in certain embodiments in which selection of particular values (or particular ranges of values) of $R_1$ and $R_2$ may be limited, currents $I_{B1}$ and $I_{B2}$ may be adjusted so as to bring about a substantially equal voltage at input signal nodes of operational amplifier 410. Thus, for example, when $R_1 = 2R_2$, $I_{B1}$ may comprise a value of (½)$I_{B2}$, so as to maintain a voltage of substantially 0.0 V across the input signal nodes of operational amplifier 410.

Figure 4C:
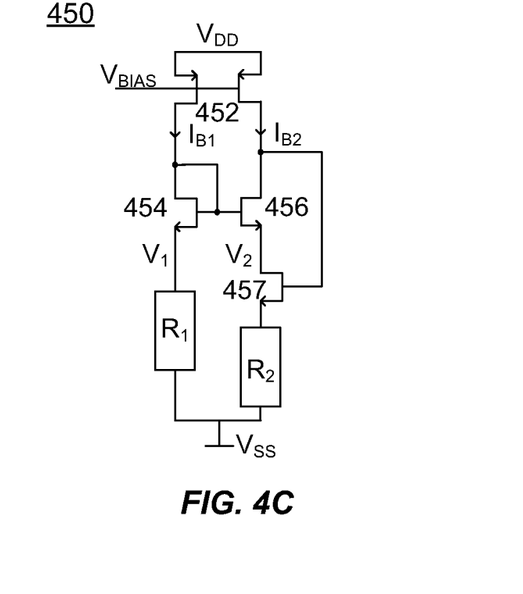
FIGS. 4C-4D are circuit diagrams illustrating circuit elements of a reference impedance in accordance with an embodiment.

FIG. 4C is a circuit diagram (450) illustrating circuit elements of a reference impedance source in accordance with an embodiment. In circuit diagram 450, transistors 452 are arranged to in a current-mirror configuration, wherein current conduction may be controlled via a bias voltage ($V_{BIAS}$) applied at the gates of transistors 452. In the current-mirror configuration of circuit diagram 450, electric current $I_{B1} = I_{B2}$, which may give rise to $V_1 = V_2$ at the source terminals of transistors 454 and 456, respectively. In circuit diagram 450, it may be appreciated that by way of insertion of, for example, $R_2$ between the source electrode of transistor 457 and $V_{SS}$, which may comprise a reference voltage (e.g., signal ground), a degree of isolation may be achieved between transistor 457 and $V_{SS}$. Presence of resistor $R_2$ may bring about other advantages, and claimed subject matter is not limited in this respect.

It should be noted that although diagram 450 indicates a single current mirror configuration comprising transistors 452, in other embodiments, additional current mirrors may be used, which may provide tighter control over variances of $I_{B1}$ and $I_{B2}$, among providing other advantages, and claimed subject matter is not limited in this respect. Additionally, transistors 454 and 456 may each be replaced by two or more transistors in a cascode configuration, which may provide higher output impedance, increased stability in transistor gain, and so forth, and claimed subject matter is not limited in this respect.

Figure 4D:
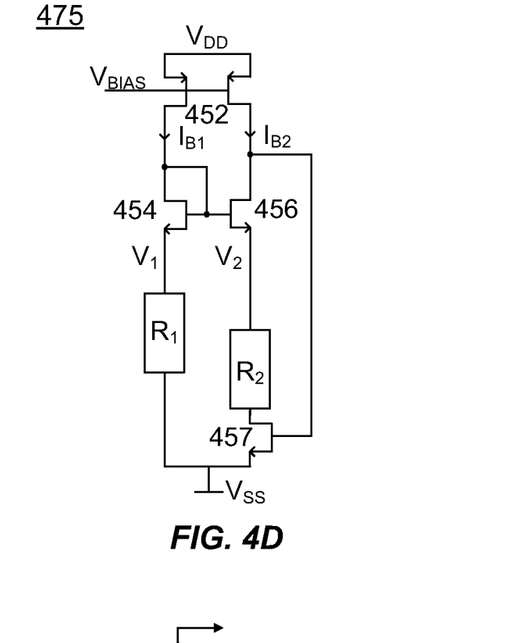

FIG. 4D is a circuit diagram (475) illustrating circuit elements of a reference impedance source in accordance with another embodiment. The circuit of FIG. 4D comprises an arrangement similar to that of FIG. 4C; however, rather than the drain electrode of transistor 452 being coupled to the gate of transistor 457, FIG. 4D indicates coupling of the drain electrode of transistor 452 to the gate of transistor 457. In particular embodiments, such coupling of the drain of transistor 452 to the gate of transistor 457 may provide a predictable signal voltage level at the gate of transistor 457 (of FIG. 4D) in comparison to the signal voltage level at the gate of transistor 457 (of FIG. 4C) due, at least in part, to the direct coupling of the source of transistor 457 to $V_{SS}$.

Figure 5A:
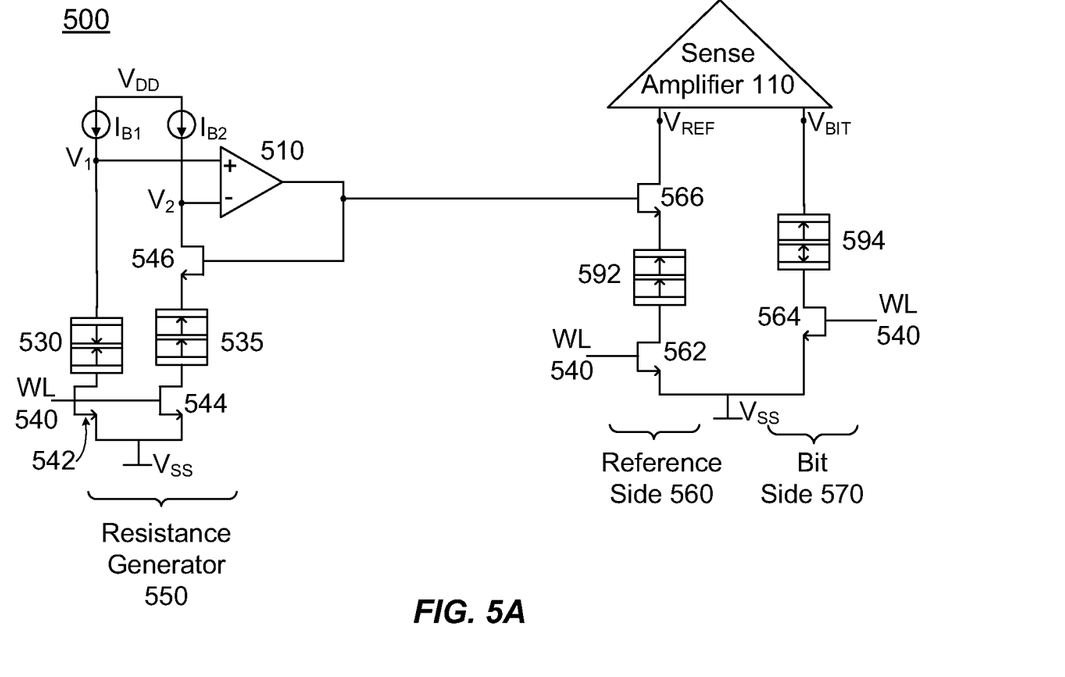
FIGS. 5A-5B are diagrams illustrating circuits utilizing a trimmable reference impedance, according to another embodiment.

FIG. 5A is a diagram (500) illustrating a circuit utilizing a trimmable reference impedance, according to an embodiment. In diagram 500, resistance generator 550 operates to emulate a resistance having a negative temperature coefficient, which may be utilized by reference side 560 in determining the high-impedance/low-impedance state of resistive memory element 594. An advantage of resistance generator 550 may comprise utilization of resistive memory elements 530 and 535, which may be fabricated utilizing the same or at least similar process as utilized to form resistive memory element 592 (placed into a long-term low-impedance state) and resistive memory element 594. Utilization of resistive memory elements 530 and 535 may bring about additional advantages, and claimed subject matter is not limited in this respect. In diagram 500, resistive memory element 530 may be placed into a high-impedance state, while resistive memory element 535 may be placed into a low-impedance state. Electric currents $I_{B1}$ and $I_{B2}$, which may be substantially equal to each other, are coupled to resistive memory elements 530 and 535 via transistor 546. Responsive to word-line 540 achieving a sufficiently positive voltage relative to $V_{SS}$, conduction of electrical current through transistors 542 and 544 may bring about a resistance $R_{MOS}$, which may be computed substantially in accordance with expression (6), below:

$$R_{MOS}=R_{HRS}(1+TC_{HRS}\cdot\Delta T)-R_{LRS}(1+TC_{LRS}\cdot\Delta T) \quad (6)$$

In expression (6), $TC_{HRS}$ corresponds to the temperature coefficient of resistive memory element 530 operating in a high-impedance state, and $TC_{LRS}$ corresponds to the temperature coefficient of resistive memory element 535 operating in a low-impedance state. Also in expression (6), $R_{HRS}$ may comprise the resistance of resistive memory element 530, which, at least in particular embodiments, may be related to the resistance of resistive memory element 535, substantially in accordance with expression (7) below:

$$R_{HRS}=R_{LRS}(1+TMR) \quad (7)$$

The "TMR" of expression (7) comprises tunnel magnetoresistance of a resistive memory element, such as a magnetic tunneling junction. It should be noted, however, that claimed subject matter is intended to embrace resistive memory elements that utilize resistive properties those brought about by magnetic tunneling junctions. In other resistive memory elements, high-impedance state resistance may be related to low-impedance state resistance by way of expressions similar to that of expression (7). Rearranging terms of expression (7) brings about expression (8), below:

$$R_{MOS} = (R_{HRS} - R_{LRS})\left(1 + \frac{1+TMR}{TMR}TC_{HRS}\Delta T\right) \quad (8)$$

It may be appreciated that $R_{MOS}$ of expression (8) utilizes $TC_{HRS}$, which, as discussed with reference to FIGS. 1B and 2B, comprises a negative temperature coefficient. Accordingly, it may further be appreciated, also from expression (8), that at least partially due to the dependency of $R_{MOS}$ on $TC_{HRS}$, reference side 560 of diagram 500 may accord with or track the negative temperature coefficient profile of a resistive memory element, such as resistive memory element 594 of bit side 570. Thus, responsive to word-line 540 achieving a signal voltage sufficient to conduct current through transistors 562 and 564, comprising a magnetic tunneling junction, the high-impedance/low-impedance state of resistive memory element 594 may be reliably determined via sense amplifier 110.

In the embodiment set forth in diagram 500, when word-line 540 achieves a signal voltage sufficient to conduct current through transistors 542, 544, 562, and 564, the drain-to-source resistance of transistor 566 may comprise a value $R_{REF}$ substantially in accordance with expression (9), below:

$$R_{REF} = \left(\frac{R_{HRS} - R_{LRS}}{2}\right)\left(1 + \frac{1+TMR}{TMR}TC_{HRS}\Delta T\right) + R_{LRS} \quad (9)$$

The output port of operational amplifier 510 comprises a substantially infinite impedance. It may be appreciated that the quantity $$\left(\frac{R_{HRS} - R_{LRS}}{2}\right)\left(1 + \frac{1+TMR}{TMR}TC_{HRS}\Delta T\right)$$

of expression (9) may be recognized as comprising $R_{MOS}/2$ of expression (8). The quantity of expression (9) comprising $R_{LRS}$ may correspond to the resistance of resistive memory element 592, which has been placed into a low-impedance state. Expression (9) may be rewritten to include the quantity $R_{LRS}$ within $$\left(\frac{R_{HRS} - R_{LRS}}{2}\right),$$

such as $$R_{REF} = \left(\frac{R_{HRS} - R_{LRS}}{2}\right)\left(1 + \frac{1+TMR}{2+TMR}TC_{HRS}\Delta T\right) \quad (10)$$

Thus, from expression (10), it may be appreciated that a reference impedance may be trimmed or adjusted so as to emphasize a contribution of the high-impedance state resistance or the low-impedance state resistance of resistive memory elements, such as resistive memory elements 530 and 535. Accordingly, the slope of resistivity versus temperature profile of a reference impedance, such as indicated in FIGS. 1A and 1B, may be tailored or optimized for various temperature ranges, resistivity ranges, and so forth.

Figure 5B:
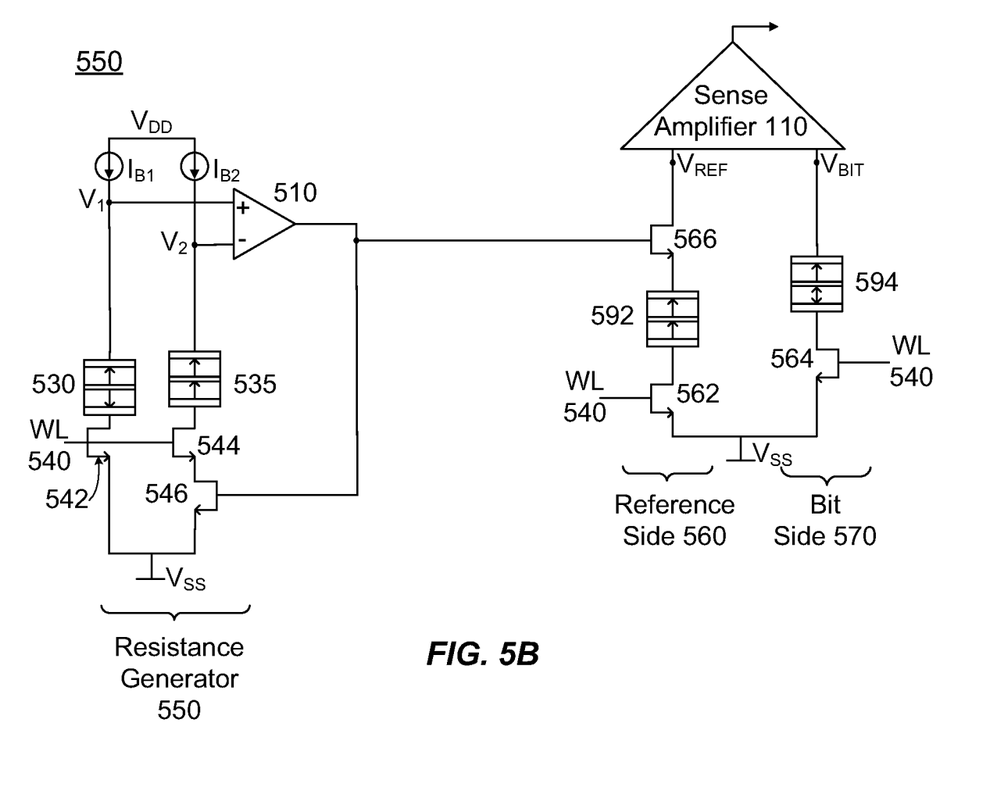

FIG. 5B is a diagram (550) illustrating a circuit utilizing a trimmable reference impedance, according to another embodiment. The circuit of FIG. 5B differs from the circuit of FIG. 5A in that transistor 546 has been repositioned so as to intervene between the source terminals of transistor 544 and a reference voltage. In particular embodiments, coupling of an output port of operational amplifier 510 to a gate of transistor 546, as shown in FIG. 5B, may provide a predictable signal voltage level at the gate of transistor 546 (of FIG. 5B) in comparison to the signal voltage level at the gate of transistor 546 (of FIG. 5A) due, at least in part, to the direct coupling of the source of transistor 546 to $V_{SS}$.

Figure 6A:
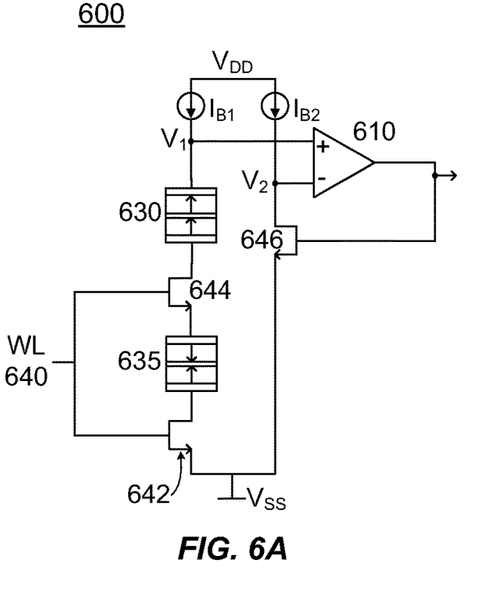
FIGS. 6A-6C are diagrams illustrating circuits utilizing a trimmable reference impedance, according to other embodiments.

FIG. 6A is a diagram (600) illustrating a circuit utilizing a trimmable reference impedance, according to another embodiment. The circuit depicted in diagram 600 may operate to emulate a resistance having a negative temperature coefficient, which may be utilized by a reference side of a sense amplifier, such as sense amplifier 110 previously discussed herein, in determining the high-impedance/low-impedance state of a resistive memory element. The circuit of diagram 600 may comprise resistive memory element 630, which may be placed into a low-impedance state, and resistive memory element 635, which may be placed into a high-impedance state. Such resistive memory elements may be fabricated utilizing the same or at least similar processes utilized to form additional resistive memory elements, for example.

In operation, responsive to word-line 640 attaining a sufficient signal voltage, electric currents $I_{B1}$ and $I_{B2}$ may conduct through transistors 644 and 646, respectively. Under such conditions, transistor 646 may present a resistance $R_{MOS}$ substantially in accordance with expression (11), below:

$$R_{MOS} = R_{HRS}(1+TC_{HRS}\cdot\Delta T) + R_{LRS}(1+TC_{LRS}\cdot\Delta T) \quad (11)$$

In expression (11), the quantity $R_{HRS}$, which may correspond to the resistance of resistive memory element 635 operating in the high impedance state may be replaced by expression (7). Accordingly, an expression substantially in accordance with (12) may result:

$$R_{MOS} = R_{LRS}(1+TMR)(1+TC_{HRS}\cdot\Delta T) + R_{LRS}(1+TC_{LRS}\cdot\Delta T) \quad (12)$$

In addition, in view of the temperature coefficient of particular resistive memory elements, such as magnetoresistive devices utilizing magnetic tunneling junctions, comprising values that may approach 0.0, the quantity $TC_{LRS}\cdot\Delta T$ of expression (12) may correspondingly approach zero. Accordingly, expression (12) may be rewritten substantially in accordance with expression (13), below:

$$R_{MOS} = (R_{HRS} + R_{LRS})\left(1 + \frac{1+TMR}{2+TMR}TC_{HRS}\Delta T\right) \quad (13)$$

Figure 1B:
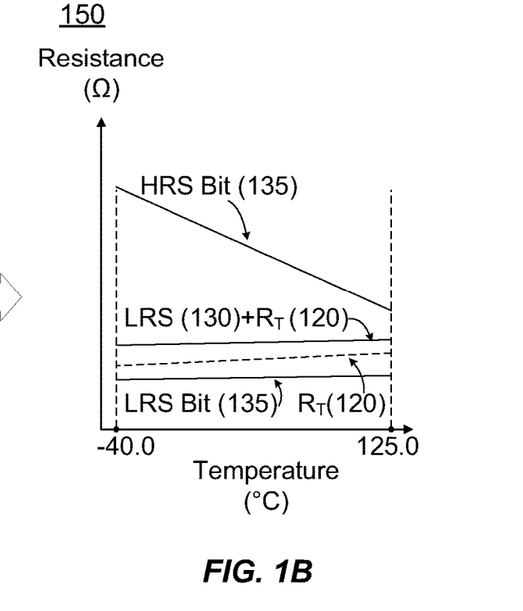
FIG. 1B is a plot of resistance as a function of temperature of various circuit elements of FIG. 1A.

It may be appreciated that expression (13) may at least partially depend on the quantity $TC_{HRS}$, which, as discussed in reference to FIGS. 1A and 1B. comprises a value less than 0.0. Consequently, responsive to $TC_{HRS}<0.0$, the temperature coefficient of $R_{MOS}$ may also comprise a value less than 0.0.

Figure 6B:
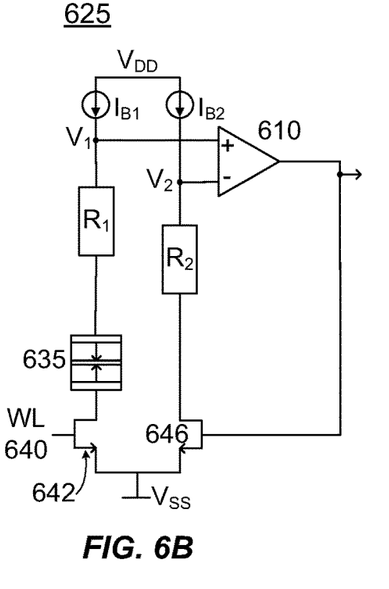

FIG. 6B is a diagram (625) illustrating a circuit utilizing a trimmable reference impedance, according to another embodiment. It may be appreciated that the circuit of FIG. 6B includes components similar to the circuit of FIG. 6A. However, the circuit of FIG. 6B comprises a first impedance represented by $R_1$ and a second impedance represented by $R_2$ having input ports coupled to input ports of operational amplifier 610. Additionally, an output of operational amplifier 610 has been coupled to a gate of transistor 646. An advantage of the circuit of FIG. 6B may comprise utilization of a single resistive memory element 635. Additionally, first and second impedances $R_1$ and $R_2$ may be more easily selectable than, for example, resistive memory element 630. Accordingly, first and second impedances $R_1$ and $R_2$ may bring about increased flexibility in the selection of resistance to be introduced by resistive memory element 635.

Figure 6C:
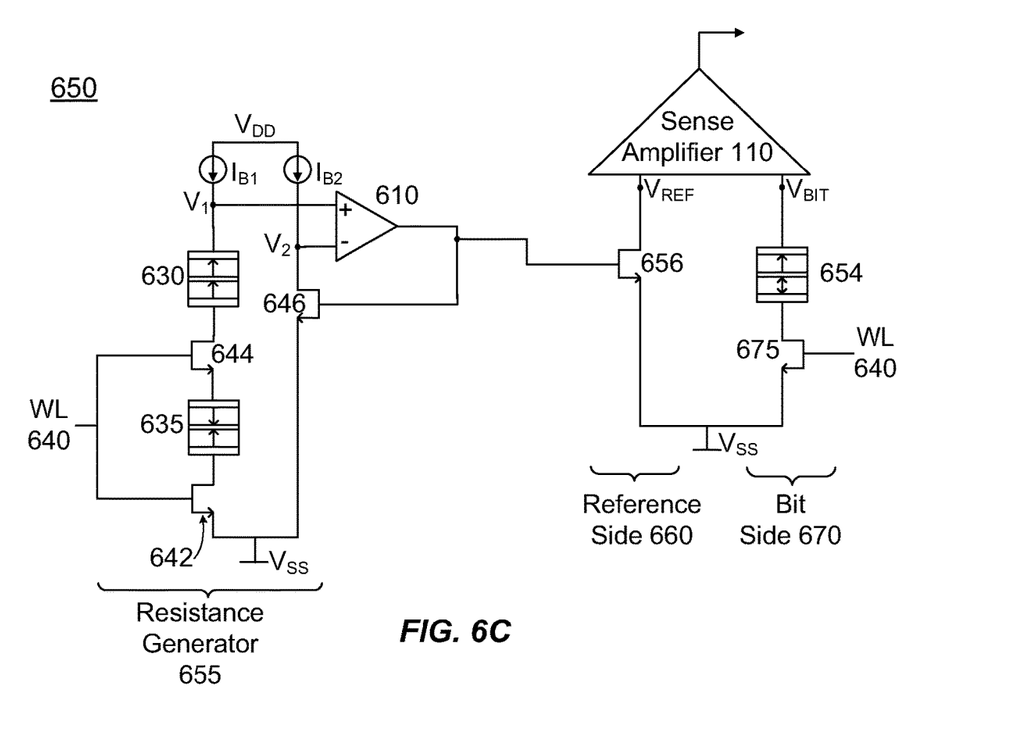

FIG. 6C is a diagram (650) illustrating circuits utilizing a trimmable reference impedance, according to another embodiment. As depicted in FIG. 6B, an output port of operational amplifier 610 may be coupled to a gate of transistor 656 at reference side 660 of sense amplifier 110. At bit side 670, resistive memory element 654 may comprise a high-impedance state or a low-impedance state, which may be determined by way of a comparison between voltage signals present at node $V_{BIT}$ and $V_{REF}$. In operation, responsive to word-line 640 attaining a voltage value sufficient to permit a current to flow through transistor 675 as well as transistors 644 and 642. In the circuit of diagram 650, based, at least in part, on resistance emulated by resistance generator 655 in combination with the resistance of the source of transistor 656, the reference impedance presented at node $V_{REF}$ may comprise a value of $R_{MOS}/2$. More particularly, a reference impedance may be computed substantially in accordance with expression (14), below:

$$R_{REF} = \frac{R_{MOS}}{2} = \left(\frac{R_{HRS} + R_{LRS}}{2}\right)\left(1 + \frac{1+TMR}{2+TMR}TC_{HRS}\cdot\Delta T\right) \quad (14)$$

Expression (14), in which $R_{REF}$ comprises a value of $R_{MOS}/2$, may represent an embodiment in which electric currents $I_{B1}$ and $I_{B2}$ are set substantially equal to each other. However, in other embodiments, electric currents $I_{B1}$ and $I_{B2}$ comprise substantially different values. For example, when $I_{B2}$ comprises a value of $\alpha \cdot I_{B1}$, ($\alpha > 1.0$) a drain-to-source voltage drop across transistor 646 may operate to amplify an impedance presented by the combination of resistive elements 630, 635, and transistor 644. In an embodiment, such amplification may be brought about responsive to increasing a current flow through transistor 646 which gives rise to an apparent reduction in the drain-to-source impedance of transistor 646. Such an apparent reduction in $R_{MOS}$, may be substantially copied or mimicked by the serial combination of resistive memory elements 630 and 635. Thus, expression (14) may be rewritten substantially in accordance with expression (15), below:

$$R_{REF} = \left(\frac{R_{HRS} + R_{LRS}}{\alpha}\right)\left(1 + \frac{1+TMR}{2+TMR}TC_{HRS}\Delta T\right) \quad (15)$$

Expression (15) may thus incorporate a scale factor of "a," which may provide an additional ability to tailor or optimize resistance generator 655 for operation within particular temperature ranges, resistivity ranges, and so forth.

Figure 7:
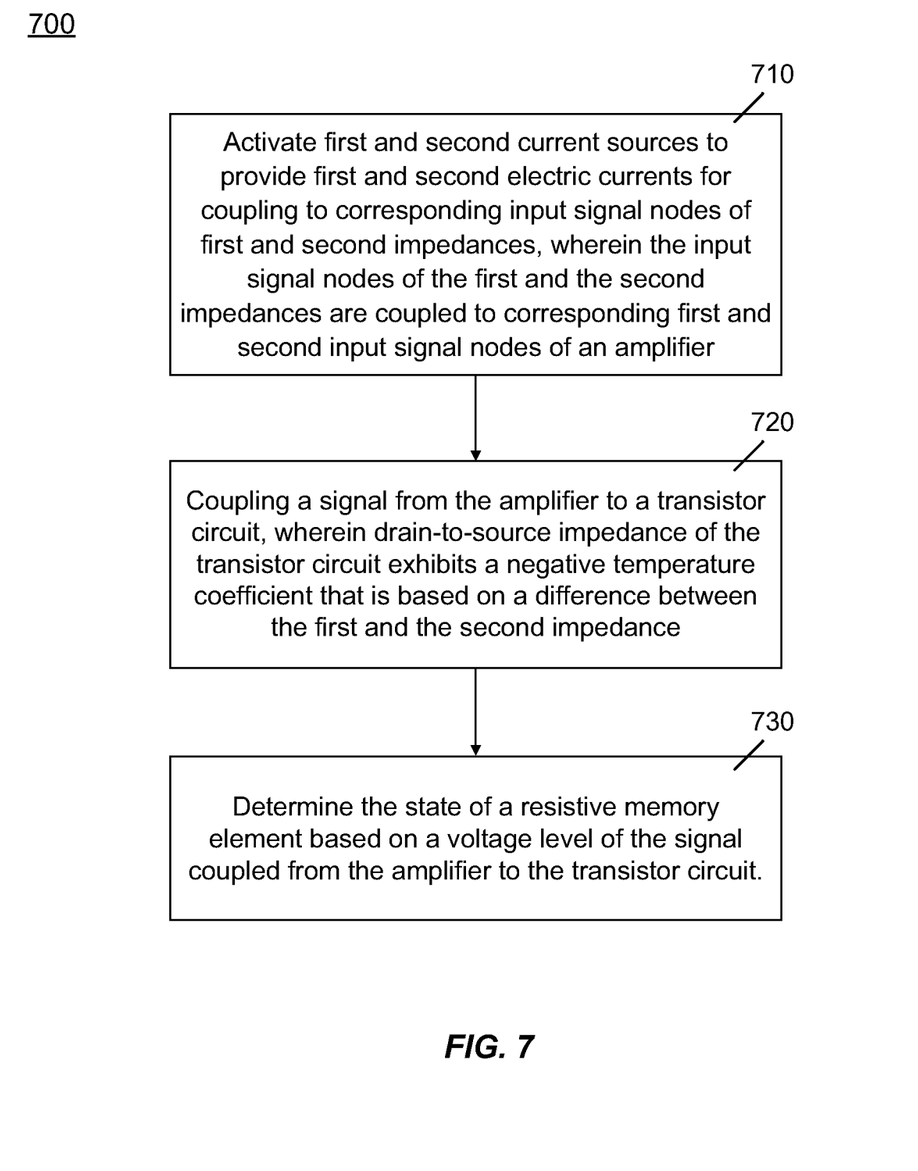
FIG. 7 is a flow chart for a method for performing comparison of a voltage signal to a reference, in accordance with various embodiments described herein.

FIG. 7 is a flow chart for a method for performing comparison of a voltage signal to a reference, in accordance with various embodiments described herein. FIG. 7 may include blocks in addition to those shown and described, fewer blocks or blocks occurring in an order different than may be identified, or any combination thereof. Method 700 may begin at block 710, which may comprise activating first and second current sources to provide first and second electric currents, such as currents $I_{B1}$ and $I_{B2}$ of FIGS. 5A-5B, FIG. 6A, and/or FIG. 6B. Block 710 may additionally comprise coupling to corresponding input signal nodes of first and second impedances, such as impedances represented by $R_1$ and $R_2$ of FIG. 4A. In block 710, the input signal nodes of the first and second impedances may be coupled to corresponding first and second input signal nodes of an amplifier, such as amplifier 410 of FIG. 4A.

Method 700 may continue at block 720, which may comprise coupling an electric current from the amplifier, such as amplifier 410 of FIG. 4A, to a transistor circuit, such as transistor 442 of FIG. 4A, wherein the drain-to-source impedance of the transistor circuit (e.g., transistor 442) emulates a negative temperature coefficient that is based on a difference between the first and the second impedance. In one or more embodiments, the first and the second impedances may be represented by impedances such as $R_1$ and $R_2$ of FIG. 4A.

Method 700 may continue at block 730, which may comprise determining the state of a resistive memory element based on a voltage level of the electric current from the amplifier to the transistor circuit. In particular embodiments, block 730 may comprise sensing, such as via sense amplifier 110 of FIG. 3A, a difference in amplitude of a voltage signal present at input signal nodes $V_{REF}$ and $V_{BIT}$. In certain embodiments, such determination of the state of a resistive memory element may be indicated by way of a voltage signal from an output port of a sense amplifier which may comprise either a relatively high level output signal or a relatively low output signal dependent on a binary logic value stored in the resistive memory element.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

What is claimed is:

1. A circuit, comprising:
    first and second current sources to provide current to corresponding input signal nodes of first and second impedances;
    an amplifier having input signal nodes coupled to the corresponding input signal nodes of the first and second impedances; and
    a transistor circuit having a gate coupled to an output signal node of the amplifier, wherein the drain-to-source impedance of the transistor circuit emulates a negative temperature coefficient that is based on a difference between the first and the second impedances.

2. The circuit of claim 1, wherein at least one of the first and second impedances comprises a positive temperature coefficient.

3. The circuit of claim 1, wherein the first and second impedances are formed from first and second resistive memory elements.

4. The circuit of claim 3, wherein a first resistive memory element of the first and second resistive memory elements is placed into a high-impedance state, and wherein a second resistive memory element of the first and second resistive memory elements is placed into a low-impedance state.

5. The circuit of claim 4, wherein the first and second resistive memory elements include correlated electron random-access memory (CERAM), resistive random-access memory (ReRAM), phase change memory, magnetic random-access memory (MRAM), or any combination thereof.

6. The circuit of claim 4, wherein the first and second resistive memory elements include magnetic random-access memory (MRAM).

7. The circuit of claim 4, wherein the first and second resistive memory elements include phase change memory.

8. The circuit of claim 1, wherein the amplifier comprises a cascoded configuration.

9. A method, comprising:
    activating first and second current sources to provide first and second electric currents for coupling to corresponding input signal nodes of first and second impedances, wherein the input signal nodes of the first and the second impedances are coupled to corresponding first and second input signal nodes of an amplifier;
    coupling a signal from the amplifier to a transistor circuit, wherein drain-to-source impedance of the transistor circuit emulates a negative temperature coefficient that is based on a difference between the first and the second impedances; and
    determining the state of a resistive memory element based on the voltage of the signal coupled from the amplifier to the transistor circuit.

10. The method of claim 9, wherein the first and the second impedances comprise positive temperature coefficients.

11. The method of claim 9, wherein the first and second impedances comprise first and second resistive memory elements.

12. The method of claim 11, further comprising placing a first resistive memory element of the first and second resistive memory elements into a high-impedance state, and placing a second resistive memory element of the first and second resistive memory elements into a low-impedance state.

13. The method of claim 9, wherein determining the state of the resistive memory element comprises comparing a reference impedance with an impedance of the resistive memory element, wherein the reference impedance is dependent on the first and the second impedances.

14. The method of claim 9, wherein the current generated by the first current source is substantially identical to the current generated by the second current source.

15. The method of claim 9, wherein the current generated by the first current source is different than the current generated by the second current source.

16. A circuit to generate, comprising:
    first and second current sources to provide substantially identical currents to corresponding input signal nodes of first and second impedances;
    an amplifier having input signal nodes coupled to the corresponding input signal nodes of the first and second impedances; and
    a transistor circuit having a first node coupled to an output signal node of the amplifier and having a second node coupled to an output signal node of an impedance of the first and second impedances, wherein the drain-to-source impedance of the transistor circuit exhibits a reference impedance that is based on a difference between the first and the second impedances.

17. The circuit of claim 16, wherein the first and second impedances comprise positive temperature coefficients.

18. The circuit of claim 16, wherein the difference between temperature coefficients of the first and second impedances comprises a negative value.

19. The circuit of claim 16, further comprising a first sense amplifier configured to determine the state of a first resistive memory element coupled to the sense amplifier based on a signal at the output signal node of the amplifier.

20. The circuit of claim 19, wherein the sense amplifier is configured to differentiate between a high-impedance state of the first resistive memory and a low-impedance state of the first resistive memory, wherein the ratio of the high-impedance state to the low-impedance state is between about 2.0:1.0 to about 400.0:1.0.

21. The circuit of claim 19, further comprising a second resistive memory coupled to the sense amplifier, wherein the second resistive memory is placed into a low-impedance state.

* * * * *